(12) United States Patent
Iwaya et al.

(10) Patent No.: US 9,911,846 B2
(45) Date of Patent: Mar. 6, 2018

(54) SEMICONDUCTOR DEVICE HAVING A BANDGAP WIDER THAN THAT OF SILICON

(71) Applicant: FUJI ELECTRIC CO., LTD., Kawasaki-shi, Kanagawa (JP)

(72) Inventors: Masanobu Iwaya, Matsumoto (JP); Makoto Utsumi, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/416,805

(22) Filed: Jan. 26, 2017

(65) Prior Publication Data
US 2017/0271509 A1   Sep. 21, 2017

(30) Foreign Application Priority Data
Mar. 16, 2016   (JP) ................................. 2016-053125

(51) Int. Cl.
| | | |
|---|---|---|
| H01L 29/00 | (2006.01) | |
| H01L 29/78 | (2006.01) | |
| H01L 29/08 | (2006.01) | |
| H01L 21/8238 | (2006.01) | |
| H01L 29/66 | (2006.01) | |
| H01L 29/49 | (2006.01) | |
| H01L 21/02 | (2006.01) | |
| H01L 21/033 | (2006.01) | |
| H01L 21/285 | (2006.01) | |
| H01L 29/16 | (2006.01) | |

(52) U.S. Cl.
CPC .... *H01L 29/7827* (2013.01); *H01L 21/02529* (2013.01); *H01L 21/0334* (2013.01); *H01L 21/28518* (2013.01); *H01L 21/823814* (2013.01); *H01L 29/0847* (2013.01); *H01L 29/1608* (2013.01); *H01L 29/4966* (2013.01); *H01L 29/665* (2013.01); *H01L 29/66068* (2013.01); *H01L 29/66666* (2013.01); *H01L 29/78* (2013.01); *H01L 2924/13091* (2013.01)

(58) Field of Classification Search
CPC ....... H01L 2924/13091; H01L 29/1608; H01L 29/78; H01L 29/4966; H01L 29/0847; H01L 21/823814; H01L 29/665
See application file for complete search history.

(56) References Cited

U.S. PATENT DOCUMENTS

2017/0178989 A1* 6/2017 Matocha ................. H01L 23/26
2017/0250275 A1* 8/2017 Yen .................... H01L 29/42356

FOREIGN PATENT DOCUMENTS

JP         4671314 B2     4/2011

* cited by examiner

*Primary Examiner* — Ngan Ngo
(74) *Attorney, Agent, or Firm* — Rabin & Berdo, P.C.

(57) ABSTRACT

An interlayer insulating film is formed on a gate insulating film and a gate electrode, and the interlayer insulating film is opened forming contact holes. Next, the interlayer insulating film and regions exposed by the contact holes are covered by a titanium nitride film, and the titanium nitride film is etched to remain only at portions of the gate insulating film and the interlayer insulating film exposed in the contact holes. The interlayer insulating film and the regions exposed by the contact holes are covered by a nickel film, and after the nickel film directly contacting the interlayer insulating film 8 is removed, the nickel film is heat treated and a nickel silicide layer is formed.

1 Claim, 5 Drawing Sheets

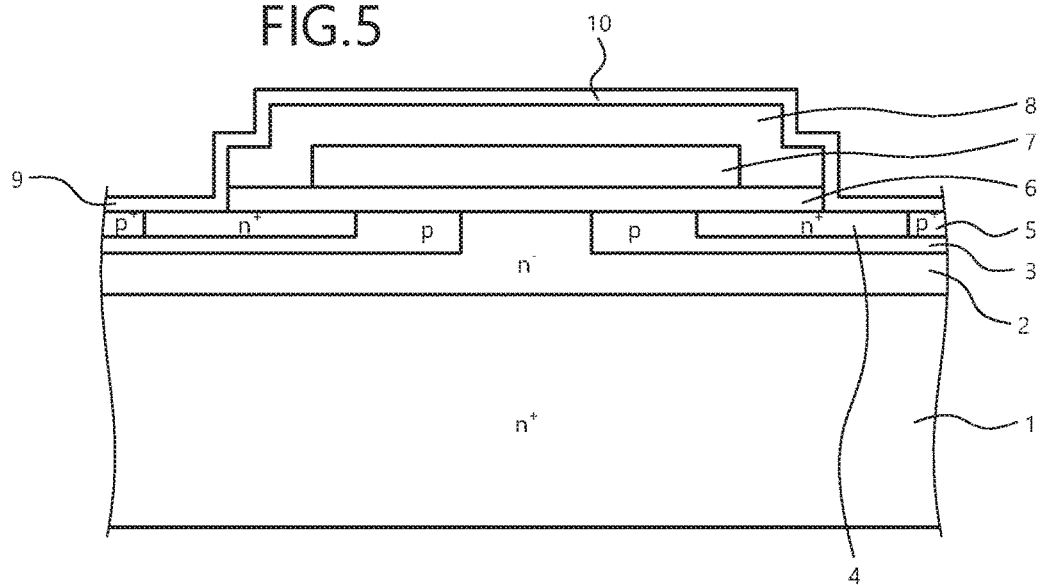
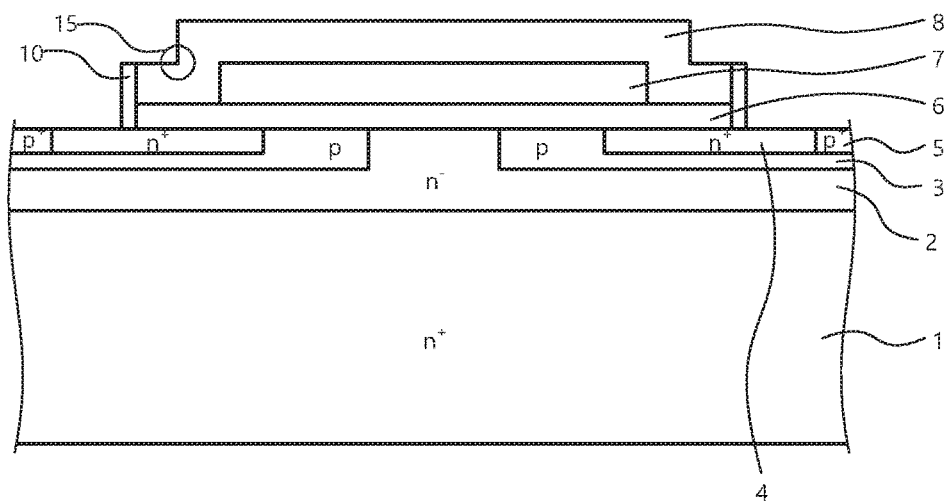

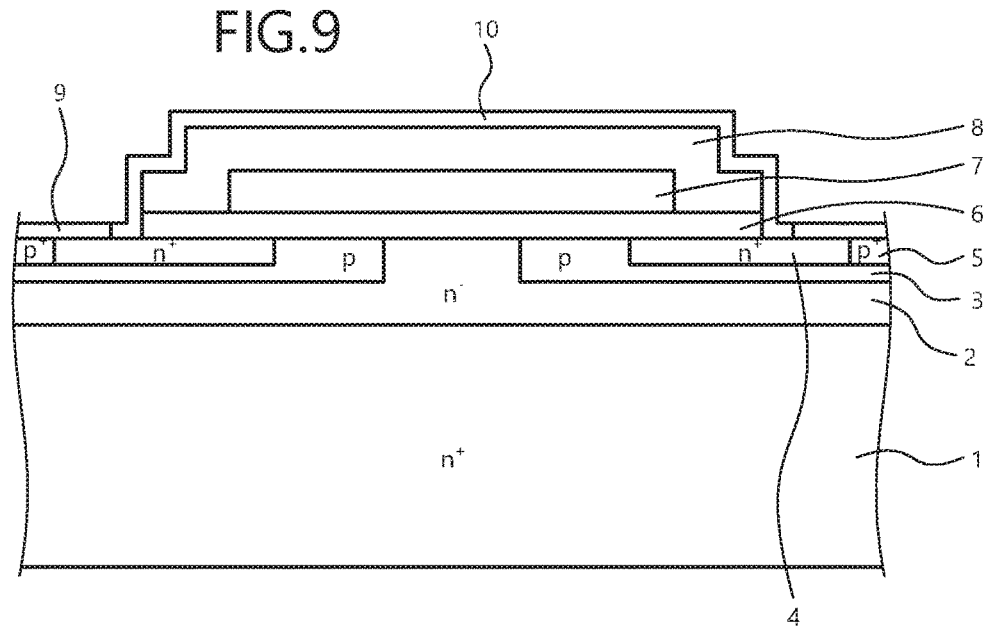

SEMICONDUCTOR DEVICE HAVING A BANDGAP WIDER THAN THAT OF SILICON

CROSS REFERENCE TO RELATED APPLICATIONS

This application is based upon and claims the benefit of priority of the prior Japanese Patent Application No. 2016-053125, filed on Mar. 16, 2016, the entire contents of which are incorporated herein by reference.

BACKGROUND OF THE INVENTION

1. Field of the Invention

Embodiments of the invention relate to a semiconductor device and method of manufacturing a semiconductor device.

2. Description of the Related Art

Conventionally, mainstream semiconductor devices employed as power devices use silicon (Si) as a semiconductor material. However, silicon carbide (SiC), which is a wide bandgap semiconductor having a wider bandgap than silicon, has thermal conductivity that is 3 times that of silicon, a critical electric field strength that is 10 times that of silicon, and an electron drift velocity that is 2 times that of silicon. Therefore, application of SiC in power devices capable of high temperature operation with low loss and a high dielectric breakdown voltage is being researched.

Even among SiC devices, in power-metal oxide semiconductor field effect transistors (MOSFETs) and insulated gate bipolar transistors (IGBT), a nickel (Ni) silicide is generally used to obtain a surface-side ohmic contact with the substrate. A method of manufacturing such is as follows.

First, after a desired impurity layer is formed on a SiC substrate, a gate insulating film is formed, and a poly-silicon pattern is formed on the gate insulating film. Next, after an interlayer insulating film is formed on the poly-silicon, a site where a contact is necessary is opened by etching. Next, a Ni film is formed at a bottom of the contact hole and a Ni silicide is formed by performing rapid thermal processing.

When the Ni silicide is formed, the Ni film contacts the interlayer insulating film whereby during the rapid thermal processing, Ni permeates the interlayer insulating film and the insulating property decreases. Thus, there is a technique of preventing the contact of the Ni film and the interlayer insulating film by use of a liftoff process (for example, refer to Japanese Patent No. 4671314).

SUMMARY OF THE INVENTION

A semiconductor device according to one aspect of the present invention includes a wide bandgap semiconductor substrate of a first conductivity type, formed of a semiconductor having a bandgap that is wider than that of silicon; a wide bandgap semiconductor deposition layer of the first conductivity type, deposited on a front surface of the wide bandgap semiconductor substrate, the wide bandgap semiconductor deposition layer having an impurity concentration that is lower than that of the wide bandgap semiconductor substrate; second-conductivity-type regions selectively provided in a surface layer of the wide bandgap semiconductor deposition layer, on an opposite side thereof with respect to a wide bandgap semiconductor substrate side; first-conductivity-type regions selectively provided in the second-conductivity-type regions; a gate insulating film provided on a surface of the wide bandgap semiconductor deposition layer between the second-conductivity-type regions and on surfaces of the second-conductivity-type regions; a gate electrode provided on the gate insulating film; an interlayer insulating film covering the gate electrode; contact holes opened in the interlayer insulating film and reaching the second-conductivity-type regions and the first-conductivity-type regions; nickel silicide layers contacting the second-conductivity-type regions and the first-conductivity-type regions at bottoms of the contact holes; a front surface electrode provided on the nickel silicide layers; and a rear surface electrode provided on a rear surface of the wide bandgap semiconductor substrate. Ends of the gate insulating film and ends of the interlayer insulating film exposed in the contact hole are covered by a titanium nitride film.

A method of manufacturing a semiconductor device according to another aspect of the invention includes forming a wide bandgap semiconductor deposition layer of a first conductivity type, on a front surface of a wide bandgap semiconductor substrate of the first conductivity type and formed of a semiconductor having a bandgap that is wider than that of silicon, the wide bandgap semiconductor deposition layer having an impurity concentration that is lower than that of the wide bandgap semiconductor substrate; selectively forming second-conductivity-type regions in a surface layer of the wide bandgap semiconductor deposition layer; selectively forming first-conductivity-type regions in the second-conductivity-type regions; forming a gate insulating film on a surface of the wide bandgap semiconductor deposition layer between the second-conductivity-type regions and on surfaces of the second-conductivity-type regions; forming a gate electrode on the gate insulating film; forming an interlayer insulating film on the gate insulating film and the gate electrode; forming contact holes opened in the interlayer insulating film and reaching the second-conductivity-type regions and the first-conductivity-type regions; covering by a titanium nitride film, the interlayer insulating film and, the second-conductivity-type regions and the first-conductivity-type regions exposed by the contact holes; etching the titanium nitride film so that portions only at ends of the gate insulating film and at ends of the interlayer insulating film exposed in the contact holes remain; covering by a nickel film, the interlayer insulating film and, the second-conductivity-type regions and the first-conductivity-type regions exposed by the contact holes; removing the nickel film directly contacting the interlayer insulating film; heat treating the nickel film so as to form a nickel silicide layer; forming a front surface electrode on the nickel silicide layer; and forming a rear surface electrode on a rear surface of the wide bandgap semiconductor substrate.

In the method of manufacturing a semiconductor device, the nickel film directly contacting the interlayer insulating film is removed by forming a resist pattern at a flat portion of a side of the gate electrode.

In the method of manufacturing a semiconductor device, the resist pattern is formed to be 0.2 to 0.8 μm larger than a resist pattern for forming the contact holes, in a direction from the ends of the interlayer insulating film and the ends of gate insulating film toward the gate electrode.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 2, 3, 4, 5, 6, and 7 are cross-sectional views depicting states of the vertical-type MOSFET according to the embodiment during manufacture;

FIG. 9 is a cross-sectional view depicting configuration of a vertical-type MOSFET in which a TiN film is formed after a contact opening is formed.

DETAILED DESCRIPTION OF THE INVENTION

Figure 1:
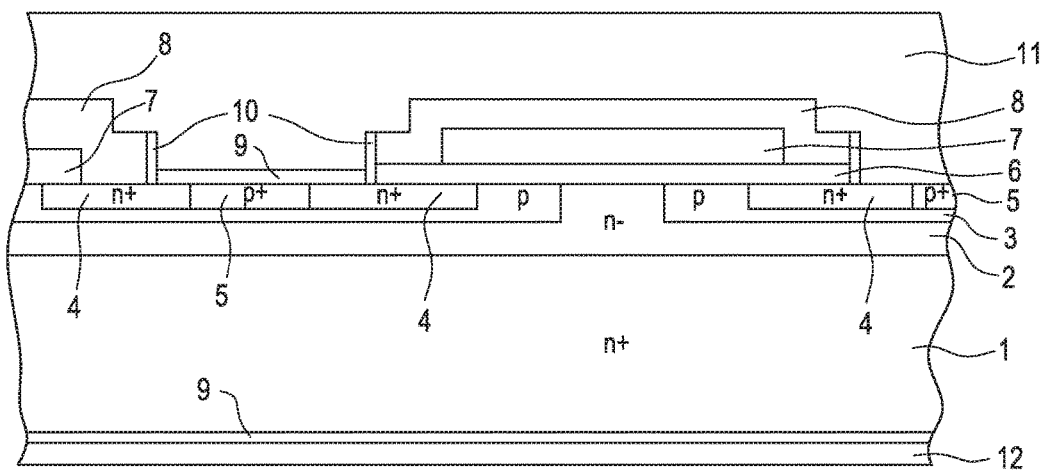
FIG. 1 is a cross-sectional view depicting a configuration of a vertical-type MOSFET according to an embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

A semiconductor device according to the present invention is formed using a wide bandgap semiconductor. In the present embodiment, description of a silicon carbide semiconductor device produced (manufactured) using, for example, silicon carbide as a wide bandgap semiconductor will be given taking a vertical-type MOSFET as an example. FIG. 1 is a cross-sectional view depicting a configuration of the vertical-type MOSFET according to the present embodiment.

As depicted in FIG. 1, the silicon carbide semiconductor device according to the present embodiment has an $n^-$-type silicon carbide epitaxial layer (wide bandgap semiconductor deposition layer of a first conductivity type) 2 deposited on a first principal surface (front surface) of an $n^+$-type silicon carbide substrate (wide bandgap semiconductor substrate of the first conductivity type) 1.

The $n^+$-type silicon carbide substrate 1, for example, a silicon carbide single-crystal substrate doped with nitrogen (N). The $n^-$-type silicon carbide epitaxial layer 2 is, for example, low-concentration n-type drift layer doped with nitrogen to have an impurity concentration lower than that of the $n^+$-type silicon carbide substrate 1. Hereinafter, the $n^+$-type silicon carbide substrate 1 and the $n^-$-type silicon carbide epitaxial layer 2 will be collectively regarded as a silicon carbide semiconductor base.

On a front surface side of the silicon carbide semiconductor base, a metal oxide semiconductor (MOS) gate structure (element structure) is formed. In particular, on a surface on an opposite side (front surface side of the silicon carbide semiconductor base) of the $n^-$-type silicon carbide epitaxial layer 2 with respect to the $n^+$-type silicon carbide substrate 1, p-type channel layers (second-conductivity-type regions) 3 are selectively formed.

In the p-type channel layer 3, $n^+$-type source regions 4 (first-conductivity-type region) are selectively formed away from the $n^-$-type silicon carbide epitaxial layer 2. Further, between the $n^+$-type source regions 4 in the p-type channel layers 3, a $p^+$-type contact region 5 having an impurity concentration higher than that of the p-type channel layer 3 is formed contacting the $n^+$-type source regions 4.

On a surface of a portion of the $n^-$-type silicon carbide epitaxial layer 2 between the p-type channel layers 3 and on a surface of the p-type channel layers 3, a gate electrode 7 is provided, via a gate insulating film 6. The gate electrode 7 may be provided on a surface of the $n^+$-type source regions 4, via the gate insulating film 6.

On the front surface of the silicon carbide semiconductor base, an interlayer insulating film 8 is formed so as to cover the gate electrode 7. In each contact hole opened in the interlayer insulating film 8, a Ni silicide layer 9 is formed contacting the $n^+$-type source region 4 and the $p^+$-type contact region 5. Further, the Ni silicide layer 9 is formed on the entire bottom of the contact hole. A source electrode 11 (front surface electrode) electrically connected to the $n^+$-type source regions 4 and the $p^+$-type contact regions 5, via the Ni silicide layer 9 is formed.

Ends of the interlayer insulating film 8 and the gate insulating film 6 exposed in each contact hole are covered by a TiN film 10. By the TiN film 10, a Ni film that forms the Ni silicide layer 9 may be hindered from contacting the interlayer insulating film 8 and nickel may be prevented from permeating into the interlayer insulating film 8.

On a second principal surface (rear surface, i.e., rear surface of the silicon carbide semiconductor base) of the $n^+$-type silicon carbide substrate 1, a rear surface electrode 12 is provided, via another Ni silicide layer 9. The rear surface electrode 12 constitutes a drain electrode.

A method of manufacturing the vertical-type MOSFET according to the present embodiment will be described. FIGS. 2, 3, 4, 5, 6, and 7 are cross-sectional views depicting states of the vertical-type MOSFET according to the present embodiment during manufacture.

Figure 2:
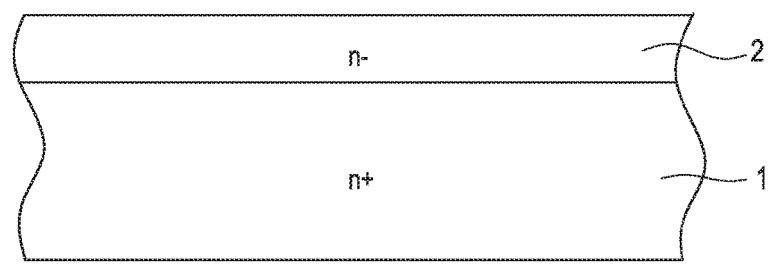

First, the $n^+$-type silicon carbide substrate 1 in which nitrogen is doped is prepared. Next, on the first principal surface of the $n^+$-type silicon carbide substrate 1, the $n^-$-type silicon carbide epitaxial layer 2 having a doped nitrogen thickness of 15 μm is formed by epitaxial growth. The state up to here is depicted in FIG. 2.

Next, on a surface of the $n^-$-type silicon carbide epitaxial layer 2, a mask having desired openings formed by photolithography, for example, is formed by a resist. A p-type impurity is ion implanted by an ion implantation method using this resist as a mask. As a result, the p-type channel layers 3 are formed in portions of a surface region of the $n^-$-type silicon carbide epitaxial layer 2. The mask used during the ion implantation for forming the p-type channel layer 3 is removed.

Next, on a surface of the p-type channel layer 3, a mask having desired openings formed by photolithography is formed by, for example, a resist. An n-type impurity is ion implanted by an ion implantation method using this resist as a mask. As a result, the $n^+$-type source region 4 is formed in a portion of a surface region of each of the p-type channel layers 3. The mask used during the ion implantation for forming the $n^+$-type source regions 4 is removed.

Next, on the surface of the p-type channel layer 3, a mask having desired openings formed by photolithography is formed by, for example, a resist. A p-type impurity is ion implanted by an ion implantation method using this resist as a mask. As a result the $p^+$-type contact region 5 is formed in a portion of the surface region of each of the p-type channel layers 3. Next, the mask used during the ion implantation for forming the $p^+$-type contact region 5 is removed.

Figure 3:
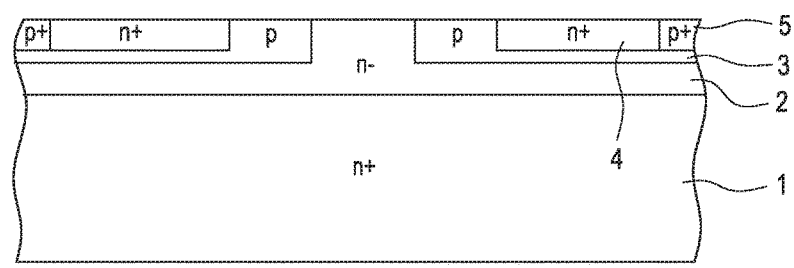

Next, heat treatment (annealing) for activating the p-type channel layer 3, the $n^+$-type source region 4, and the $p^+$-type contact region 5 is performed. Here, the sequence in which the $n^+$-type source region 4 and the $p^+$-type contact region 5 are formed may be changed variously. The state up to here is depicted in FIG. 3.

Next, the front surface side of the silicon carbide semiconductor base is thermally oxidized, forming the gate insulating film 6. As a result, the n⁻-type silicon carbide epitaxial layer 2 and each region formed on the surface of the n⁻-type silicon carbide epitaxial layer 2 are covered by the gate insulating film 6.

Next, for example, doped poly-silicon is formed on the gate insulating film 6 as the gate electrode 7. The doped poly-silicon is patterned and selectively removed so that the doped poly-silicon remains on a surface of the n⁻-type silicon carbide epitaxial layer 2 between the p-type channel layers 3 and on the surface of the p-type channel layers 3. At this time, the doped poly-silicon on the n⁺-type source region 4 may be left.

Figure 4:
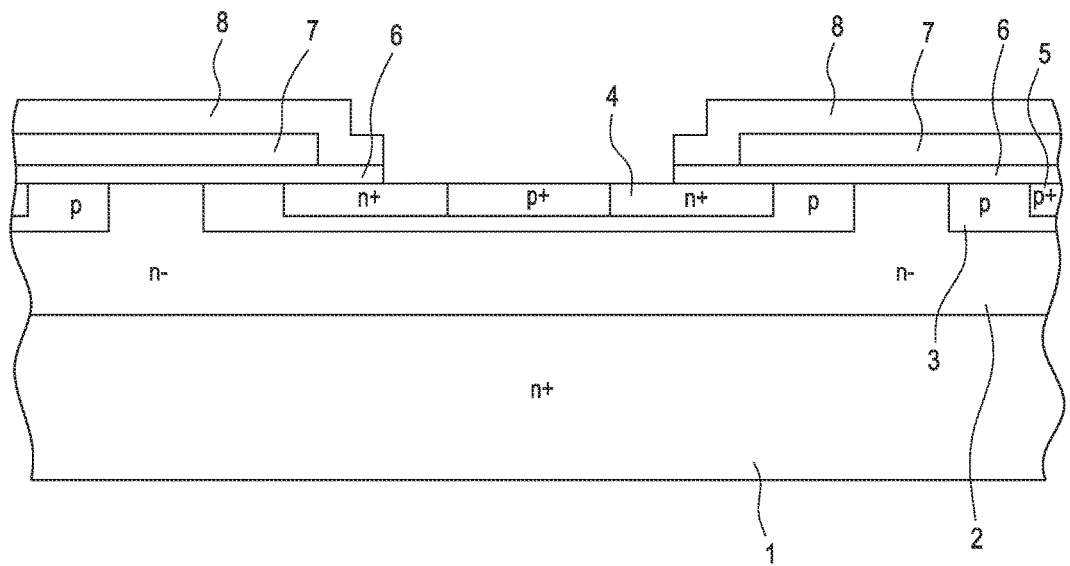

The interlayer insulating film 8 is formed so as to cover the gate electrode 7. The interlayer insulating film 8 is patterned and selectively removed whereby, contact holes are formed, exposing the n⁺-type source regions 4 and the p⁺-type contact regions 5. Here, since the gate electrode 7 has a width that is shorter than a width of the gate insulating film 6, a step portion 15 is created in the interlayer insulating film 8. The state up to here is depicted in FIG. 4.

Next, the TiN film 10 is formed on the entire front surface side of the silicon carbide semiconductor base. As a result, a surface (surface on the opposite side from the n⁺-type silicon carbide substrate 1) of each of the n⁺-type source regions 4 and a surface of each of the p⁺-type contact regions 5 exposed by the contact holes, ends of the interlayer insulating film 8 and ends of the gate insulating film 6 exposed by the contact holes, and a surface (surface on the opposite side from the n⁺-type silicon carbide substrate 1) of the interlayer insulating film 8 are covered by the TiN film 10. The state up to here is depicted in FIG. 5.

Next, the entire surface on the front surface side of the silicon carbide semiconductor base is etched. As a result, the TiN film 10 is removed from the surfaces of the n⁺-type source regions 4 s and the surfaces of the p⁺-type contact regions 5 exposed by the contact hole, and is removed from the surface of the interlayer insulating film 8. In other words, at the ends of the interlayer insulating film 8 and at the ends of the gate insulating film 6 exposed by the contact holes, the TiN film 10 remains as a spacer. Here, the TiN film 10 may remain at the step portion 15 of the interlayer insulating film 8. The state up to here is depicted in FIG. 6.

Next, on the front surface side of the silicon carbide semiconductor base, a Ni film 13 is formed on the entire surface. As a result, the surfaces of the n⁺-type source regions 4 and the surfaces of the p⁺-type contact region 5 exposed by the contact holes, the ends of the interlayer insulating film 8 and the ends of the gate insulating film 6 covered by the TiN film 10, and the surface of the interlayer insulating film 8 are covered by the Ni film 13.

Figure 7:
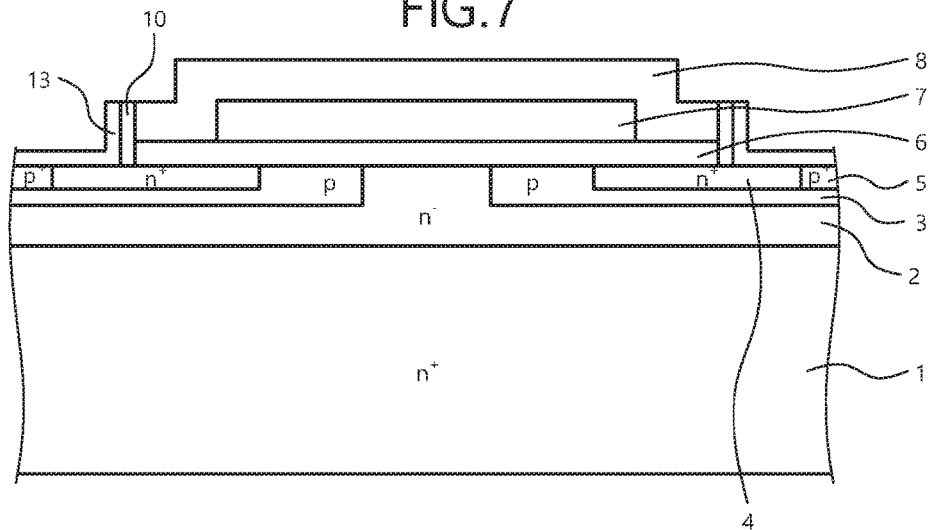

The Ni film 13 directly contacting the interlayer insulating film 8 is removed by a photolithography process. The reason for this is that when a pattern is formed in a state in which the Ni film 13 is contacting the interlayer insulating film 8, in the heat treatment thereafter, permeation of the nickel into the interlayer insulating film 8 occurs whereby, the insulating property of the interlayer insulating film 8 decreases causing short circuit defects. As a result of this removal, the Ni film 13 remains on the surfaces of the n⁺-type source regions 4 and the surfaces of the p⁺-type contact regions 5 exposed by the contact holes, and on the ends of the interlayer insulating film 8 and the ends of the gate insulating film 6 covered by the TiN film 10. The state up to here is depicted in FIG. 7.

However, in this photolithography process, since pattern formation is performed by a wet etching process, side etching occurs and etching from an interface of the resist and the Ni film 13 progresses whereby dimension control is difficult.

Therefore in the present embodiment, a resist pattern is formed at a flat portion 16 of a side of the gate electrode 7. Here, the flat portion 16 is a top surface of the TiN film 10 and a top surface of an end portion of the interlayer insulating film 8, which are one step higher than the contact hole. As a result, with good controllability, a pattern of the Ni film 13 may be formed on the surfaces of the n⁺-type source regions 4 and the surfaces of the p⁺-type contact regions 5 exposed by the contact holes, and at the ends of the interlayer insulating film 8 and the ends of the gate insulating film 6. In other words, a pattern is formed in which the Ni film 13 does not contact the interlayer insulating film 8.

Figure 8:
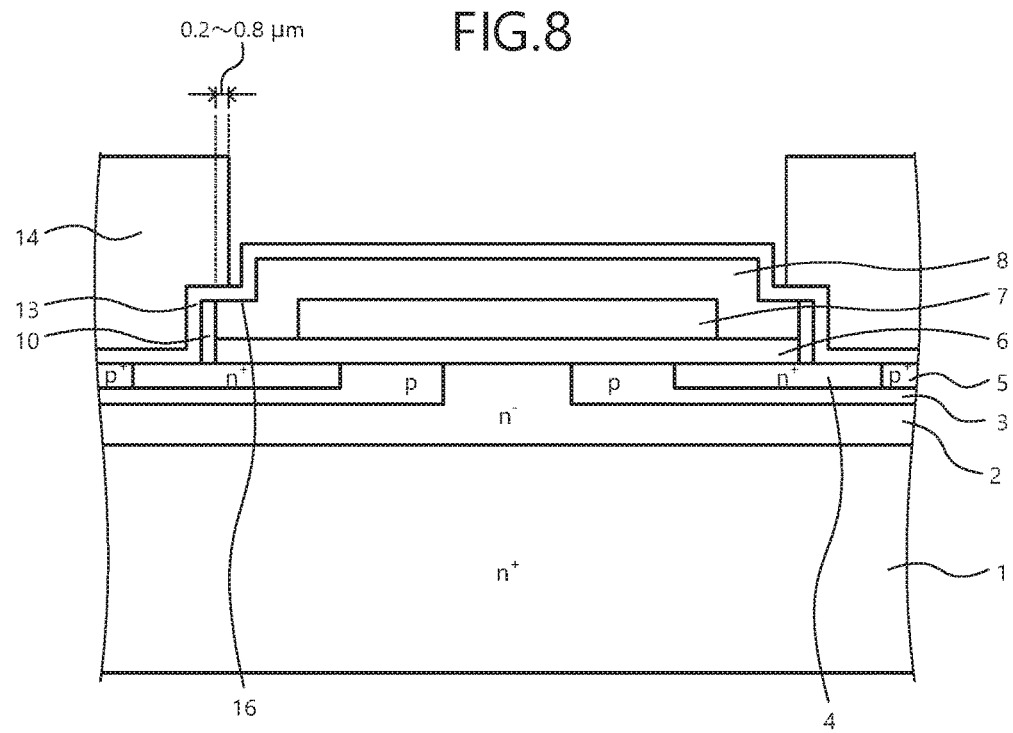
FIG. 8 is a cross-sectional view depicting a resist pattern in a photolithography process for an Ni film.

FIG. 8 is a cross-sectional view depicting a resist pattern 14 in the photolithography process for the Ni film. The resist pattern 14 in this photolithography process is formed to be larger than a resist pattern for forming the contact holes, by 0.2 to 0.8 μm in a direction of the gate electrode 7. In particular, as depicted in FIG. 8, the resist pattern 14 of 5.4 to 7.0 μm is formed to be larger by 0.2 to 0.8 μm from the ends of the interlayer insulating film 8 and the ends of the gate insulating film 6 in a direction of the gate electrode 7. Although the resist pattern 14 is formed to be larger, since wet etching is performed, after the etching, the pattern becomes smaller. It was confirmed by experiment that by forming the end of the resist pattern 14 at the flat portion 16, the Ni film 13 on the interlayer insulating film 8 is etched and only remains in the contact holes.

Next, the Ni film 13 is further formed on the entire surface of the rear side of the silicon carbide semiconductor base, silicon carbide semiconductor portions (the n⁺-type silicon carbide substrate 1, the n⁺-type source region 4, and the p⁺-type contact region 5) are caused to react with the Ni film 13 by sintering (heat treatment) whereby, the Ni silicide layers 9 are formed, forming ohmic contacts with the silicon carbide semiconductor portions. After formation of the Ni silicide layer 9, a process of removing unreacted Ni by etching may be added. Finally, metal films that become the electrodes on the front surface and the rear surface are formed whereby, the MOSFET depicted in FIG. 1 is completed.

As described above, according to the semiconductor device of the embodiment, a TiN film is formed at the ends of the interlayer insulating film and at the ends of the gate insulating film whereby, the TiN film prevents Ni from permeating the interlayer insulating film. Further, since the Ni silicide layer may be formed on the entire bottom of the contact hole, contact resistance is not increased. In particular, contact resistance may be reduced 30 percent relative to the vertical-type MOSFET depicted in FIG. 9 and in which a TiN film is formed after the contact opening.

Further, since an opening for the TiN film needs not be formed again in the contact opening, the contact opening may be reduced in size and does not become a factor when the device cell pitch is reduced.

According to the method of manufacturing a semiconductor device of the embodiment, by the resist pattern 14 of 5.4 to 7.0 μm, an Ni pattern that is substantially the same is formed. In a state where stepwise differences in the interlayer insulating film, the contact hole, etc. are present, the manner in which the side etching occurs differs from photolithography of a flat surface and photolithography of a flat surface has better controllability, enabling pattern formation and is advantageous when reducing the cell pitch.

In the present invention, although a case of a MOS gate structure being on a first principal surface of a silicon carbide substrate formed of silicon carbide has been described as an example, without limitation hereto, the type of wide bandgap semiconductor (for example, gallium nitride (GaN), etc.), orientation of the substrate primary surface, etc. may be variously changed. Further, in the present invention, although the first conductivity type is assumed to be an n-type and a second conductivity type is assumed to be a p-type in the embodiments, the present invention is implemented similarly when the first conductivity type is a p-type and the second conductivity type is an n-type.

As for the method of Japanese Patent No. 4671314, a problem arises in that since wet etching is used in forming the contact holes, the method is not suited for minuteness and at liftoff, foreign matter is adhered. Thus, a method is conceivable where a titanium nitride (TiN) film is formed on an interlayer insulating film, and Ni is prevented from permeating the interlayer insulating film. In particular, after contact opening formation, a TiN film is formed on the entire surface of the SiC substrate by reactive sputtering (hereinafter, sputtering) or the like, and the portion of the contact hole bottom converted to a silicide is dry etched to form an opening in the TiN film. Next, by sputtering or vapor deposition, a Ni film is formed in the opening of the TiN film and rapid thermal processing is performed whereby, a Ni silicide is formed.

FIG. 9 is a cross-sectional view depicting configuration of a vertical-type MOSFET in which a TiN film is formed after a contact opening is formed. As depicted in FIG. 9, when the TiN film is formed at the contact hole bottom, in anticipation of shifts in alignment and dimensional precision, the width of the TiN film opening has to be made smaller than the width of the contact opening. Therefore, the area in which the Ni silicide layer 9 may be formed decreases and a problem arises in that the contact resistance increases. Further, since the TiN film opening is formed in the contact opening, the contact opening cannot be reduced in size, arising in a problem that the contact opening becomes a factor when the device cell pitch is reduced.

According to the invention described, a TiN film is formed at the ends of the interlayer insulating film and at the ends of the gate insulating film whereby, the TiN film enables Ni to be prevented from permeating the interlayer insulating film. Further, since the Ni silicide layer may be formed on the entire contact hole bottom, the contact resistance does not increase. In particular, the contact resistance may be reduced about 30 percent compared to the vertical-type MOSFET of FIG. 9 and in which the TiN film is formed after the contact opening formation.

Further, since no opening for the TiN film need be formed again in the contact opening, the contact opening may be reduced in size and when the device cell pitch is reduced, the contact opening is not a factor.

According to the semiconductor device and the method of manufacturing a semiconductor device of the present invention, an effect is achieved in that when a nickel silicide is formed, nickel may be prevented from permeating the interlayer insulating film, without increase of the contact resistance or becoming a factor in reducing the cell pitch.

As described, the semiconductor device and the method of manufacturing a semiconductor device according to the present invention are useful in high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a wide bandgap semiconductor substrate of a first conductivity type, formed of a semiconductor having a bandgap that is wider than that of silicon;
   a wide bandgap semiconductor deposition layer of the first conductivity type, deposited on a front surface of the wide bandgap semiconductor substrate, the wide bandgap semiconductor deposition layer having an impurity concentration that is lower than that of the wide bandgap semiconductor substrate;
   second-conductivity-type regions selectively provided in a surface layer of the wide bandgap semiconductor deposition layer, the surface layer located on an opposite side of the wide bandgap semiconductor deposition layer with respect to the wide bandgap semiconductor substrate;
   first-conductivity-type regions selectively provided in the second-conductivity-type regions;
   a gate insulating film provided on a surface of the wide bandgap semiconductor deposition layer between the second-conductivity-type regions and on surfaces of the second-conductivity-type regions;
   a gate electrode provided on the gate insulating film;
   an interlayer insulating film covering the gate electrode;
   contact holes opened in the interlayer insulating film and reaching the second-conductivity-type regions and the first-conductivity-type regions;
   nickel silicide layers contacting the second-conductivity-type regions and the first-conductivity-type regions at bottoms of the contact holes;
   a front surface electrode provided on the nickel silicide layers; and
   a rear surface electrode provided on a rear surface of the wide bandgap semiconductor substrate, wherein
   ends of the gate insulating film and ends of the interlayer insulating film exposed in the contact hole are covered by a titanium nitride film.

* * * * *